(12) United States Patent
Tsukidate et al.

(10) Patent No.: US 11,569,019 B2
(45) Date of Patent: Jan. 31, 2023

(54) ELECTRONIC COMPONENT

(71) Applicant: TAIYO YUDEN CO., LTD., Tokyo (JP)

(72) Inventors: Hitoshi Tsukidate, Tokyo (JP); Takuma Kuroyanagi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1290 days.

(21) Appl. No.: 15/985,967

(22) Filed: May 22, 2018

(65) Prior Publication Data

US 2018/0358167 A1 Dec. 13, 2018

(30) Foreign Application Priority Data

Jun. 8, 2017 (JP) .............................. JP2017-113673

(51) Int. Cl.
*H01F 27/28* (2006.01)
*H03H 7/01* (2006.01)
(Continued)

(52) U.S. Cl.
CPC ........... *H01F 27/2804* (2013.01); *H01F 3/14* (2013.01); *H01F 17/0006* (2013.01); *H01F 17/04* (2013.01); *H01F 27/06* (2013.01); *H03H 7/01* (2013.01); *H03H 9/059* (2013.01); *H03H 9/0523* (2013.01); *H03H 9/0542* (2013.01); *H03H 9/0547* (2013.01); *H03H 9/0566* (2013.01); *H03H 9/542* (2013.01);
(Continued)

(58) Field of Classification Search
CPC ........ H01F 27/2804; H01F 3/14; H01F 27/06; H03H 7/01; H04J 1/045; H05K 1/0296; H05K 1/165
See application file for complete search history.

(56) References Cited

U.S. PATENT DOCUMENTS

2006/0114077 A1 6/2006 Mizuno et al.
2007/0045773 A1 3/2007 Mi et al.
(Continued)

FOREIGN PATENT DOCUMENTS

JP H6-215951 A 8/1994
JP 2006-157738 A 6/2006
(Continued)

OTHER PUBLICATIONS

Japanese Office Action dated Feb. 2, 2021, in a counterpart Japanese patent application No. 2017-113673. (A machine translation (not reviewed for accuracy) attached.).

*Primary Examiner* — Doon Y Chow
(74) *Attorney, Agent, or Firm* — Chen Yoshimura LLP

(57) ABSTRACT

An electronic component includes: a first substrate having a first surface; a second substrate having a second surface facing the first surface across an air gap; a first coil pattern that is located on the first surface so as to face the second surface across the air gap; a second coil pattern that is located in a second region on the second surface and faces the first surface across the air gap, at least a part of the second region overlapping with a first region in plan view, the first region being formed of a region in which the first coil pattern is located and a region surrounded by the first coil pattern; and a connection terminal connecting the first coil pattern and the second coil pattern.

9 Claims, 11 Drawing Sheets

(51) Int. Cl.

| | |
|---|---|
| *H01F 27/06* | (2006.01) |
| *H01F 3/14* | (2006.01) |
| *H05K 1/02* | (2006.01) |
| *H05K 1/16* | (2006.01) |
| *H04J 1/04* | (2006.01) |
| *H03H 9/05* | (2006.01) |
| *H03H 9/64* | (2006.01) |
| *H01F 17/00* | (2006.01) |
| *H03H 9/72* | (2006.01) |
| *H03H 9/60* | (2006.01) |
| *H01F 17/04* | (2006.01) |
| *H03H 9/70* | (2006.01) |
| *H03H 9/54* | (2006.01) |

(52) U.S. Cl.
CPC .......... *H03H 9/605* (2013.01); *H03H 9/6483* (2013.01); *H03H 9/706* (2013.01); *H03H 9/725* (2013.01); *H04J 1/045* (2013.01); *H05K 1/0296* (2013.01); *H05K 1/165* (2013.01)

(56) References Cited

U.S. PATENT DOCUMENTS

| | | | |
|---|---|---|---|
| 2009/0166068 A1* | 7/2009 | Takahashi | H05K 1/16 174/258 |
| 2014/0132386 A1* | 5/2014 | Kostelnik | H01F 5/00 336/200 |
| 2014/0210310 A1* | 7/2014 | Kuroyanagi | H03H 9/1071 310/313 R |

FOREIGN PATENT DOCUMENTS

| | | |
|---|---|---|
| JP | 2007-59839 A | 3/2007 |
| JP | 2007-67236 A | 3/2007 |
| JP | 2008-300734 A | 12/2008 |
| JP | 2009-164221 A | 7/2009 |
| JP | 2014-75534 A | 4/2014 |
| JP | 2016-58964 A | 4/2016 |

* cited by examiner

ELECTRONIC COMPONENT

CROSS-REFERENCE TO RELATED APPLICATION

This application is based upon and claims the benefit of priority of the prior Japanese Patent Application No. 2017-113673, filed on Jun. 8, 2017, the entire contents of which are incorporated herein by reference.

FIELD

A certain aspect of the present invention relates to an electronic component.

BACKGROUND

It has been known to use an inductor such as a coil for an acoustic wave filter or the like. It has been known to provide a coil in a substrate on which an acoustic wave filter or the like is mounted. In addition, it has been known to provide coils spaced apart in a longitudinal direction through air gaps on a substrate as disclosed in, for example, Japanese Patent Application Publication No. 2006-157738.

SUMMARY OF THE INVENTION

According to an aspect of the present invention, there is provided an electronic component including: a first substrate having a first surface; a second substrate having a second surface facing the first surface across an air gap; a first coil pattern that is located on the first surface so as to face the second surface across the air gap; a second coil pattern that is located in a second region on the second surface and faces the first surface across the air gap, at least a part of the second region overlapping with a first region in plan view, the first region being formed of a region in which the first coil pattern is located and a region surrounded by the first coil pattern; and a connection terminal connecting the first coil pattern and the second coil pattern.

DETAILED DESCRIPTION

When a coil is provided in a substrate, the fabrication process is easy and the size is reduced. However, since the coil is surrounded by the insulating material of the substrate, the Q-value of the coil deteriorates. When coils are provided in the longitudinal direction through air gaps, the Q-value of the coil is improved. However, the fabrication process becomes complicating. In addition, since the coils are provided separately from the substrate and the acoustic wave filter, the size increases.

Hereinafter, a description will be given of embodiments of the present invention with reference to the accompanying drawings.

First Embodiment

Figure 1:
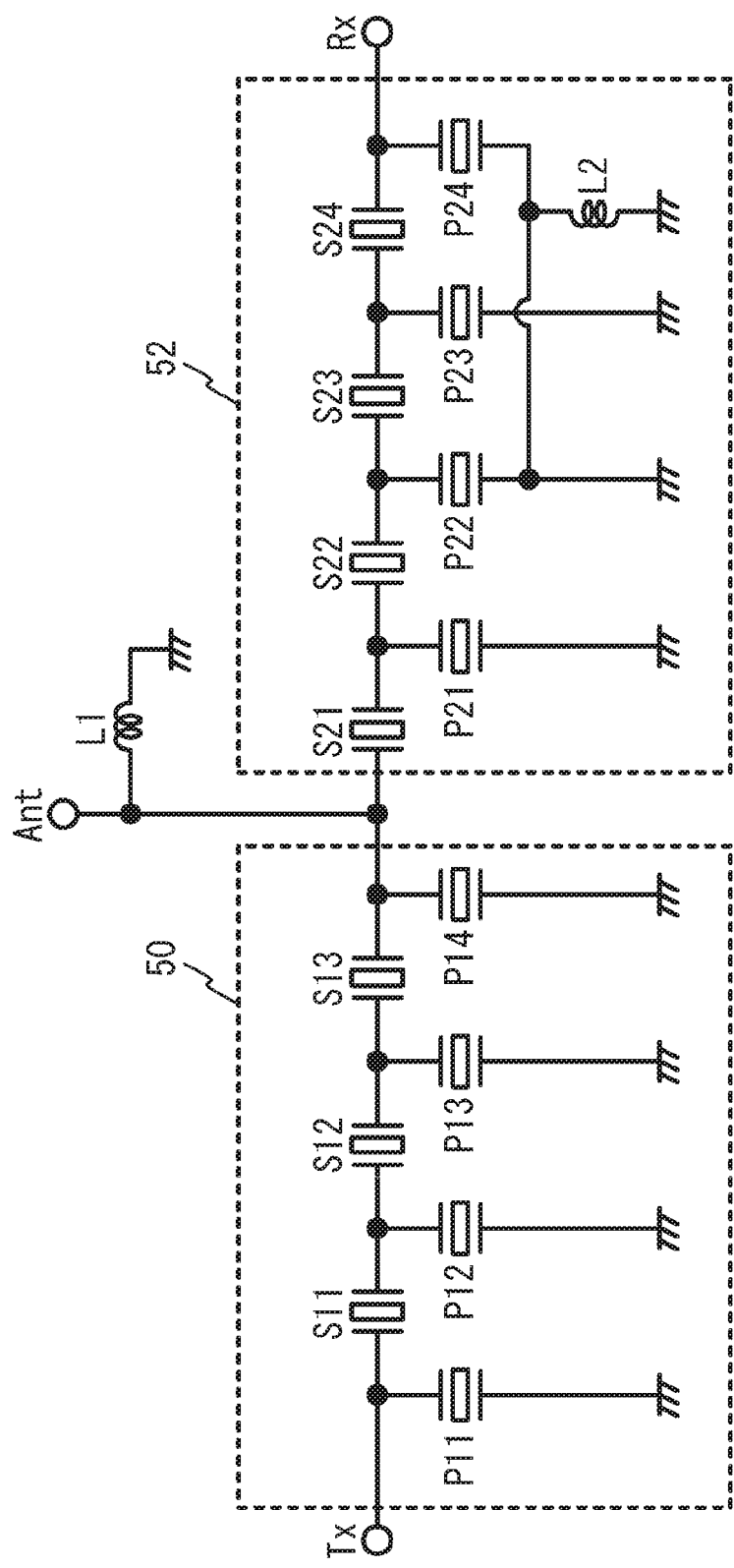
FIG. 1 is a circuit diagram of an electronic component in accordance with a first embodiment.

FIG. 1 is a circuit diagram of an electronic component in accordance with a first embodiment. As illustrated in FIG. 1, a transmit filter 50 is connected between a common terminal Ant and a transmit terminal Tx. A receive filter 52 is connected between the common terminal Ant and a receive terminal Rx. In the transmit filter 50, series resonators S11 through S13 are connected in series and parallel resonators P11 through P14 are connected in parallel between the common terminal Ant and the transmit terminal Tx. In the receive filter 52, series resonators S21 through S24 are connected in series and parallel resonators P21 through P24 are connected in parallel between the common terminal Ant and the receive terminal Rx. An inductor L1 is connected between the common terminal Ant and a ground. An inductor L2 is connected between ground terminals of the parallel resonators P22 and P24 and a ground.

The transmit filter 50 transmits signals in the transmit band to the common terminal Ant among high-frequency signals input to the transmit terminal Tx, and suppresses signals with other frequencies. The receive filter 52 transmits signals in the receive band to the receive terminal Rx among high-frequency signals input to the common terminal Ant, and suppresses signals with other frequencies. The inductor L1 is a matching circuit between the common terminal Ant and the transmit filter 50 and the receive filter 52. The inductor L2 is an inductor for forming an attenuation pole outside the passband.

Figure 2:
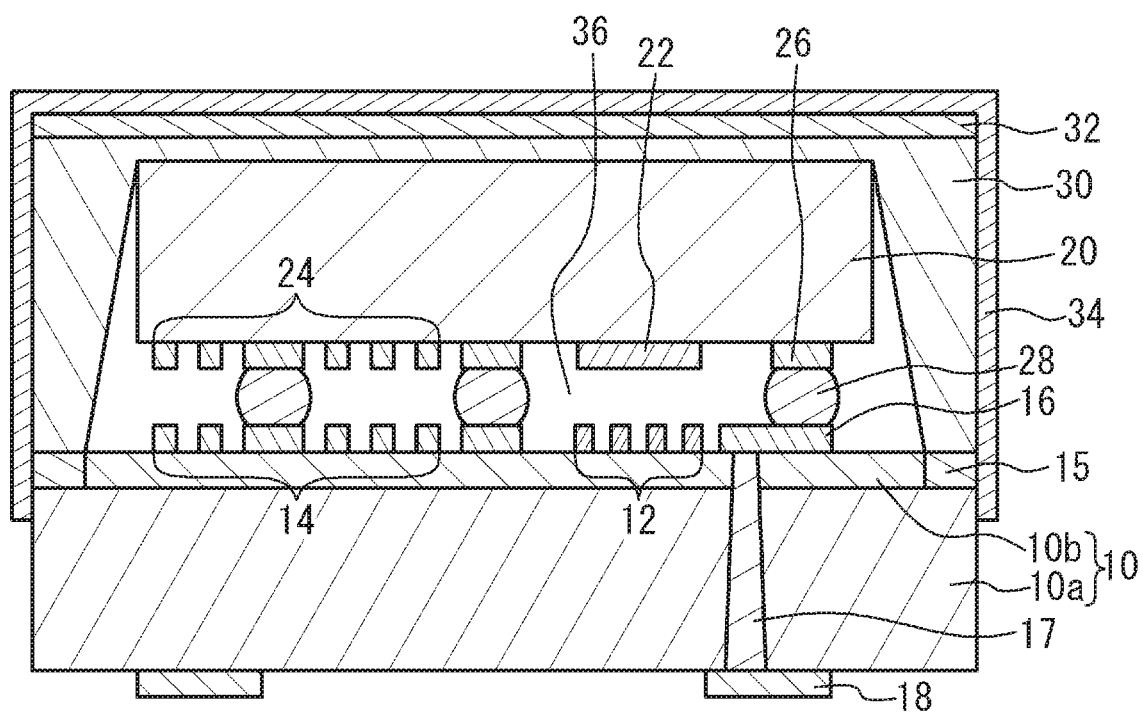
FIG. 2 is a cross-sectional view of the electronic component in accordance with the first embodiment.

FIG. 2 is a cross-sectional view of the electronic component in accordance with the first embodiment. As illustrated in FIG. 2, a substrate 20 is mounted on a substrate 10. The substrate 10 has a support substrate 10a and a piezoelectric substrate 10b. The support substrate 10a is, for example, a sapphire substrate, a spinel substrate, an alumina substrate, a silicon oxide substrate (for example, a crystal substrate), or a silicon substrate. The piezoelectric substrate 10b is, for example, a lithium tantalate substrate or a lithium niobate substrate. The piezoelectric substrate 10b is bonded on the upper surface of the support substrate 10a. The bonded surface between the piezoelectric substrate 10b and the support substrate 10a is plane and flat. The piezoelectric substrate 10b has a thickness of, for example, 1 μm to 20 μm. The support substrate 10a has a thickness of, for example, 250 μm.

Acoustic wave elements 12, a coil 14, and wiring lines 16 are located on the upper surface of the substrate 10. Terminals 18 are located on the lower surface of the substrate 10. The terminals 18 are foot pads for connecting the acoustic wave elements 12 and 22 to external devices. Via wirings 17 are provided so as to penetrate through the substrate 10. The via wiring 17 electrically connects the wiring line 16 and the terminal 18. The coil 14, the wiring lines 16, the via wirings 17, and the terminals 18 are formed of a metal layer such as, for example, a copper layer, an aluminum layer, a gold layer, or a tungsten layer. The terminals 18 include the common terminal Ant, the transmit terminal Tx, the receive terminal Rx, and ground terminals.

The acoustic wave elements 22, a coil 24, and wiring lines 26 are located on the lower surface of the substrate 20. The substrate 20 is, for example, a sapphire substrate, a spinel substrate, an alumina substrate, a glass substrate, or a silicon substrate. The coil 24 and the wiring lines 26 are formed of, for example, the lower electrode and the upper electrode of the piezoelectric thin film resonator, or a metal layer such as a copper layer, an aluminum layer, or a gold layer. The wiring line 16 of the substrate 10 and the wiring line 26 of the substrate 20 are bonded to each other through a bump 28. The upper surface of the substrate 10 and the lower surface of the substrate 20 face each other across an air gap 36.

A ring-shaped electrode 15 is located in the periphery of the upper surface of the substrate 10. A sealing portion 30 is located on the substrate 10 so as to surround the substrate 20. The sealing portion 30 is bonded to the ring-shaped electrode 15. The sealing portion 30 is, for example, metal such as solder or an insulating material such as resin. A lid 32 is located on the upper surface of the sealing portion. The lid 32 is, for example, a metal plate of kovar or an insulator plate. A protective film 34 is located so as to cover the sealing portion 30 and the lid 32. The protective film 34 is, for example, a metal film made of nickel or an insulating film.

Figure 3:
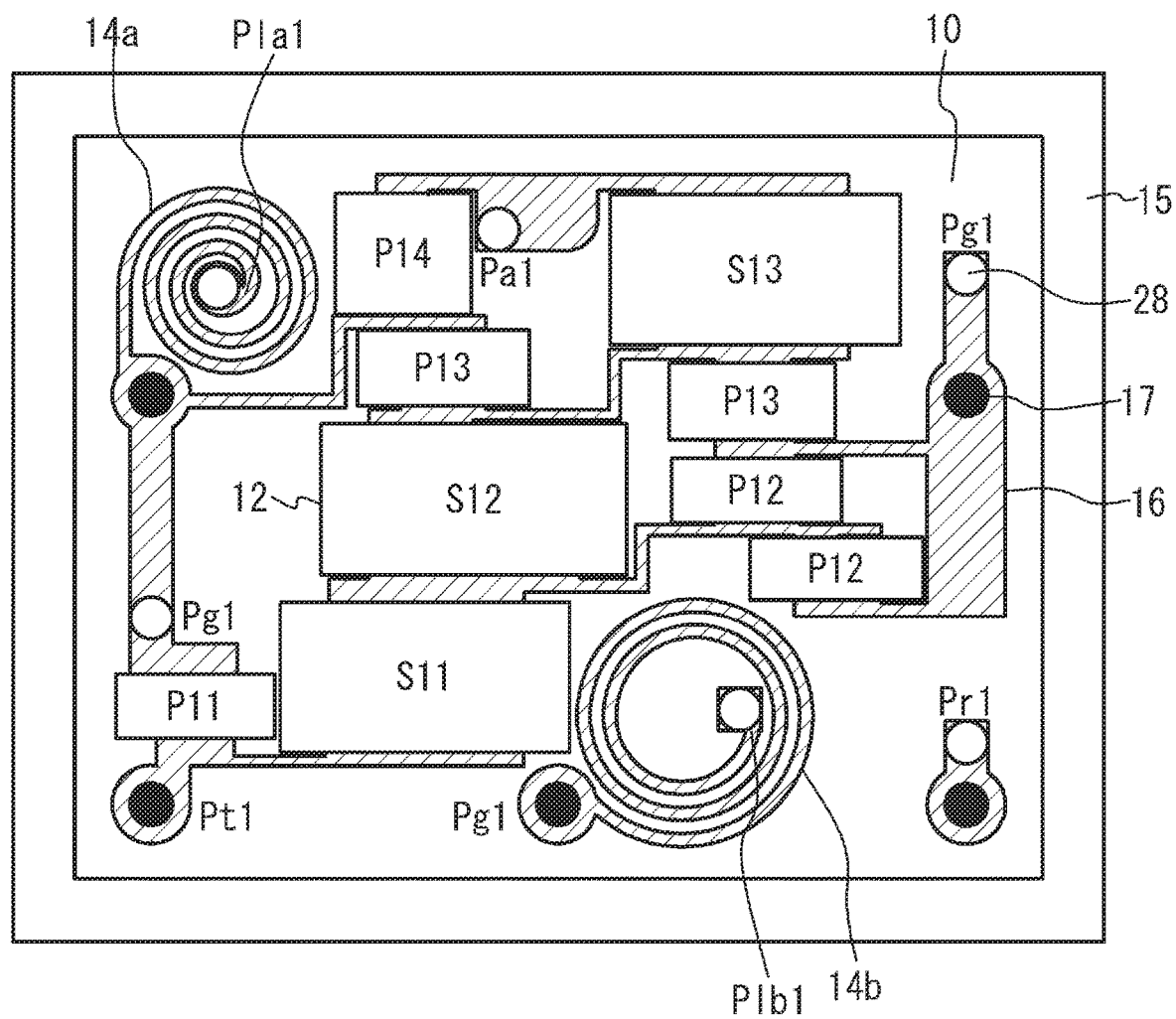
FIG. 3 is a plan view of the upper surface of a substrate 10 in the first embodiment.

FIG. 3 is a plan view illustrating the upper surface of the substrate 10 in the first embodiment. As illustrated in FIG. 3, the acoustic wave elements 12, coils 14a and 14b, the wiring lines 16, and the ring-shaped electrode 15 are located on the substrate 10. The wiring lines 16 include pads Pa1, Pt1, Pr1, Pg1, Pla1, and Plb1. The pads Pa1, Pt1, Pr1, and Pg1 are respectively connected to the common terminal Ant, the transmit terminal Tx, the receive terminal Rx, and the ground terminals through the via wirings 17.

The series resonators S11 through S13 are connected in series and the parallel resonators P11 through P14 are connected in parallel through the wiring lines 16 between the pads Pa1 and Pt1. The parallel resonators P12 and P13 are divided in parallel. The series resonators S11 through S13 and the parallel resonators P11 through P14 form the transmit filter 50.

Figure 4:
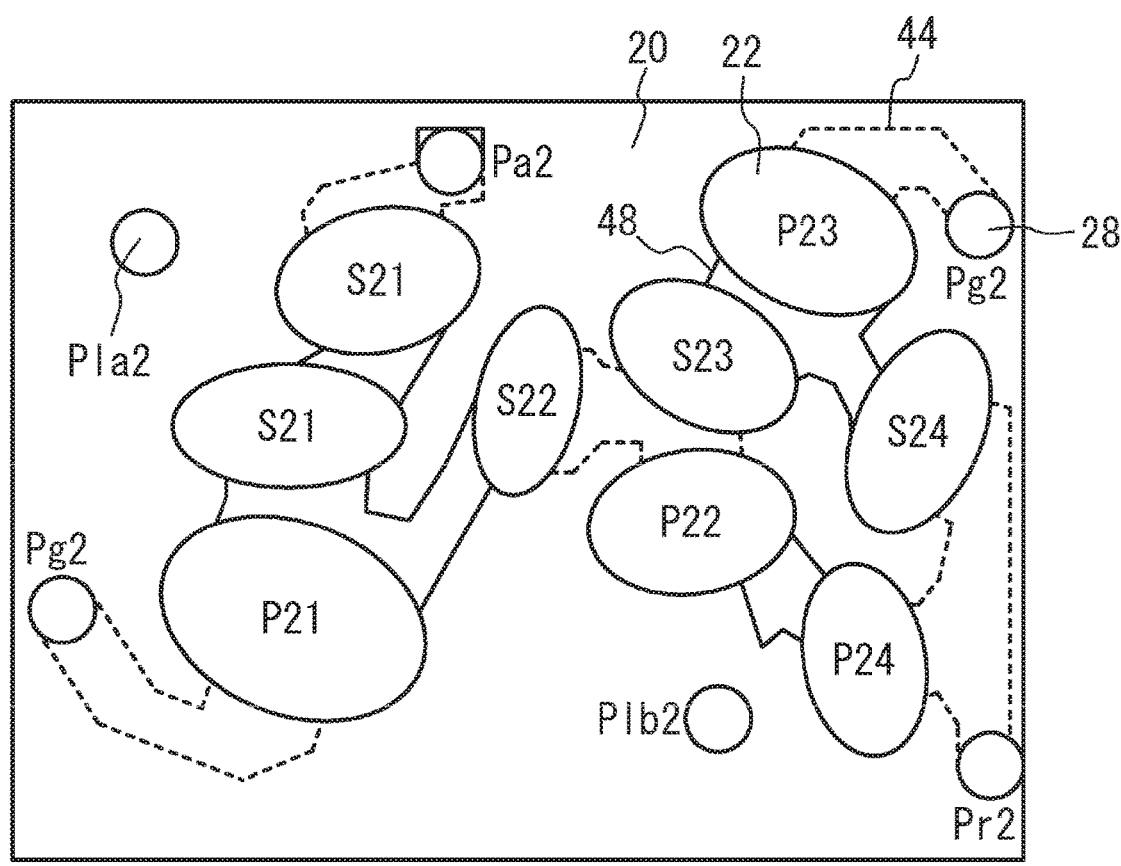
FIG. 4 is a plan view (No. 1) of the lower surface of a substrate 20 in the first embodiment as transparently viewed from above.
Figure 5:
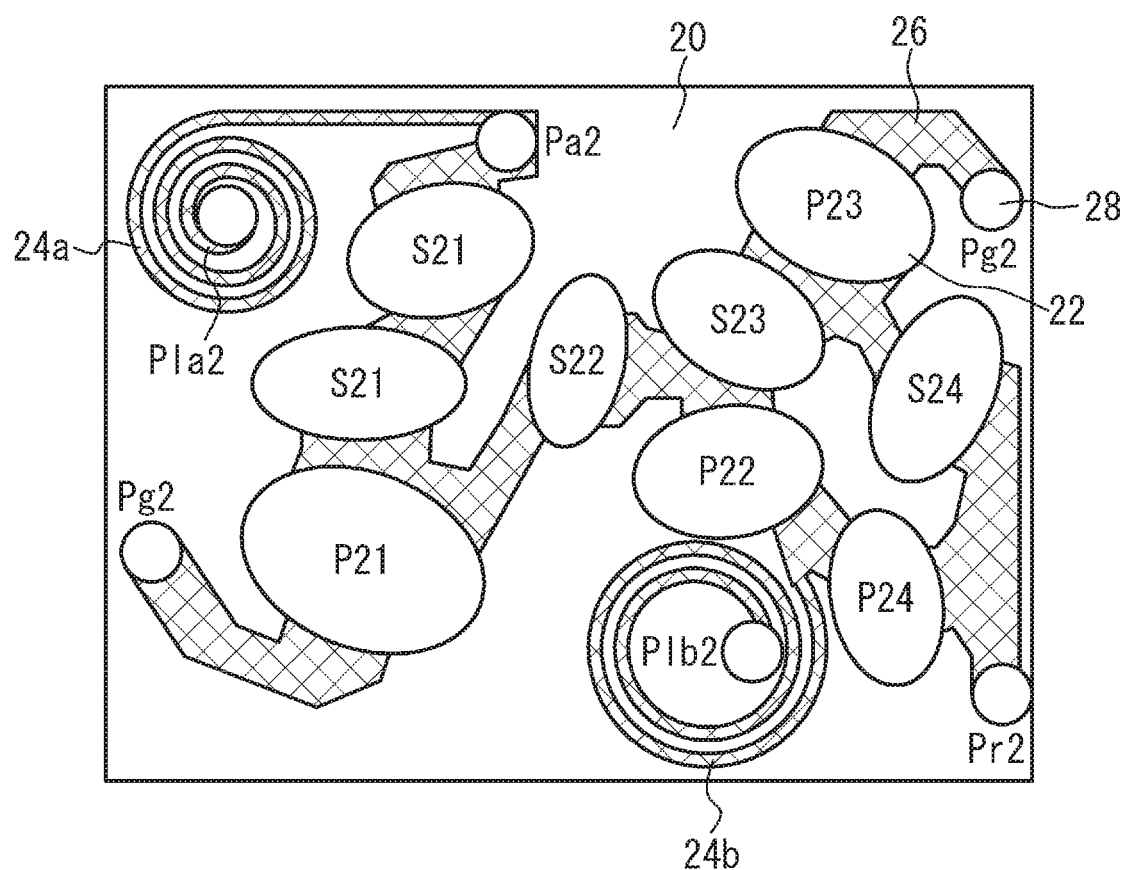
FIG. 5 is a plan view (No. 2) of the lower surface of the substrate 20 in the first embodiment as transparently viewed from above.

FIG. 4 and FIG. 5 are plan views of the lower surface of the substrate 20 in the first embodiment as transparently viewed from above. FIG. 4 illustrates the acoustic wave elements 22, lower electrodes 44, and upper electrodes 48, while FIG. 5 illustrates the acoustic wave elements 22, coils 24a and 24b, and the wiring lines 26. As illustrated in FIG. 4 and FIG. 5, the acoustic wave elements 22, the coils 24a and 24b, and the wiring lines 26 are located on the substrate 20. The acoustic wave elements 22 are connected through the lower electrode 44 and the upper electrode 48. The wiring lines 26 are located on the lower electrode 44 and the upper electrode 48 other than the acoustic wave elements 22. The coils 24a and 24b are formed of the material identical to the material of the wiring line 26. The wiring lines 26 include pads Pa2, Pr2, Pg2, Pla2, and Plb2. The pads Pa2, Pr2, and Pg2 are respectively connected to the common terminal Ant, the receive terminal Rx, and the ground terminals through the bumps 28, the wiring lines 16, and the via wirings 17.

Between the pads Pa2 and Pr2, the series resonators S21 through S24 are connected in series and the parallel resonators P21 through P24 are connected in parallel through the lower electrodes 44, the upper electrodes 48, and the wiring lines 26. The series resonator S21 is serially divided. The series resonators S21 through S24 and the parallel resonators P21 through P24 form the receive filter 52.

The coils 14a and 24a form the inductor L1. An electric current flows from the pad Pa2 of the substrate 20 to the pad Pg1 through the coil 24a, the pad Pla2, the bump 28, the pad Pla1 of the substrate 10, and the spiral coil 14a. Similarly, the coils 14b and 24b form the inductor L2. An electric current flows from the wiring line 26 between the parallel resonators P22 and P24 of the substrate 20 to the pad Pg1 through the coil 24b, the pad Plb2, the bump 28, the pad Plb1, and the coil 14b.

Figure 6A:
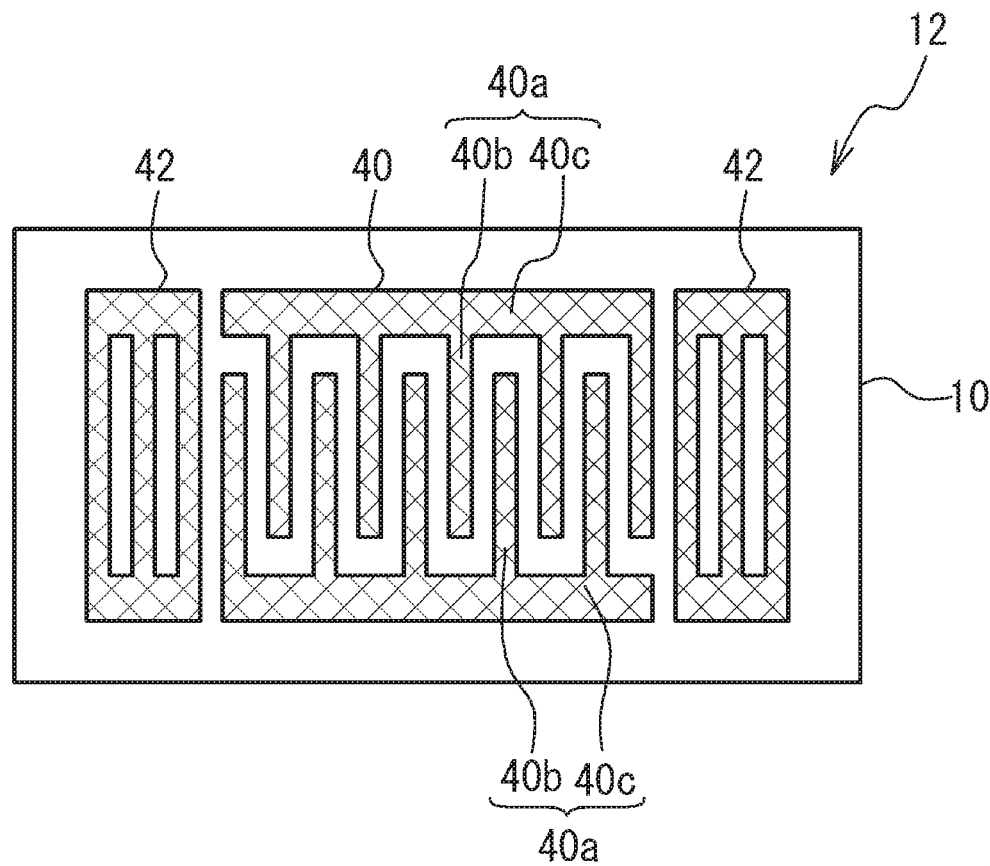
FIG. 6A is a plan view of an acoustic wave element 12 in the first embodiment.
Figure 6B:
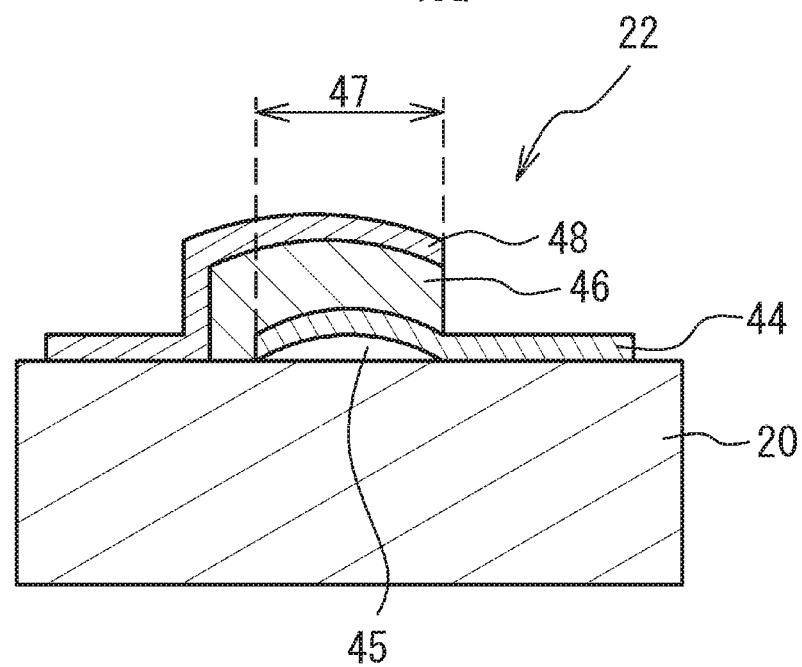
FIG. 6B is a cross-sectional view of an acoustic wave element 22 in the first embodiment.

FIG. 6A is a plan view of the acoustic wave element 12 in the first embodiment, and FIG. 6B is a cross-sectional view of the acoustic wave element 22 in the first embodiment. As illustrated in FIG. 6A, the acoustic wave element 12 is a surface acoustic wave resonator. An interdigital transducer (IDT) 40 and reflectors 42 are formed on the piezoelectric substrate 10b of the substrate 10. The IDT 40 has a pair of comb-shaped electrodes 40a facing each other. The comb-shaped electrode 40a includes electrode fingers 40b and a bus bar 40c connecting the electrode fingers 40b. The reflectors 42 are located at both sides of the IDT 40. The IDT 40 excites a surface acoustic wave on the substrate 10. The IDT 40 and the reflectors 42 are formed of, for example, an aluminum film or a copper film. A protective film or a temperature compensation film may be provided on the substrate 10 so as to cover the IDT 40 and the reflectors 42.

As illustrated in FIG. 6B, the acoustic wave element 22 is a piezoelectric thin film resonator. A piezoelectric film 46 is located on the substrate 20. The lower electrode 44 and the upper electrode 48 are located so as to sandwich the piezoelectric film 46. An air gap 45 is formed between the lower electrode 44 and the substrate 20. The region where the lower electrode 44 and the upper electrode 48 face each other across at least a part of the piezoelectric film 46 is a resonance region 47. The lower electrode 44 and the upper electrode 48 in the resonance region 47 excite the acoustic wave in the thickness extension mode in the piezoelectric film 46. The lower electrode 44 and the upper electrode 48 are formed of a metal film such as, for example, a ruthenium film. The piezoelectric film 46 is, for example, an aluminum nitride film. The acoustic wave elements 12 and 22 include electrodes exciting the acoustic wave. Thus, the acoustic wave elements 12 and 22 are covered with the air gap 36 so that the excitation of the acoustic wave is not inhibited.

Figure 7A:
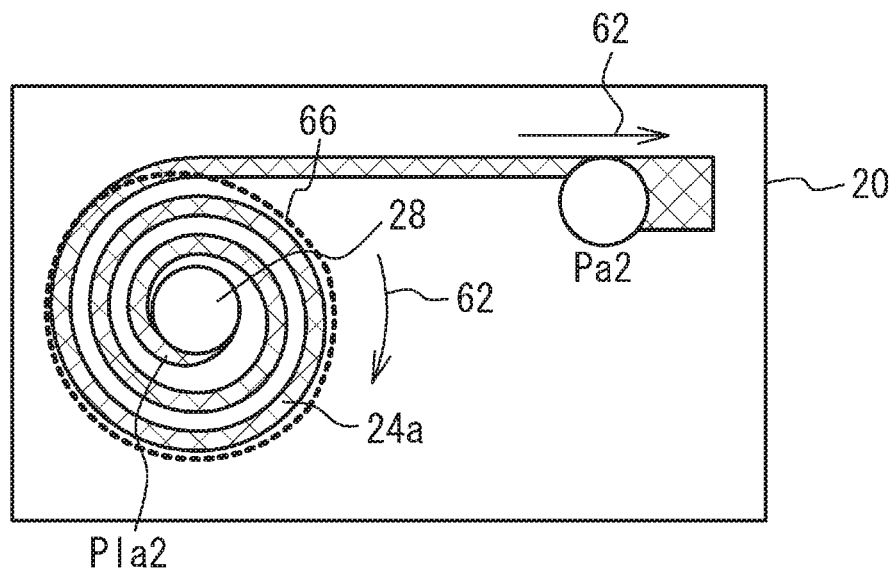
FIG. 7A is a plan view of a coil 24a in the first embodiment as transparently viewed from above.
Figure 7B:
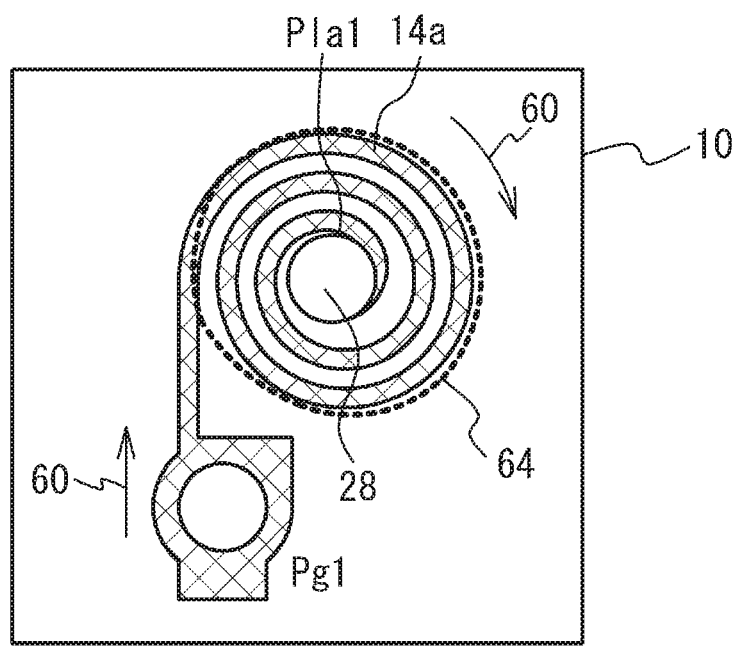
FIG. 7B is a plan view of a coil 14a, and FIG. 7C is a circuit diagram of coils.
Figure 7C:
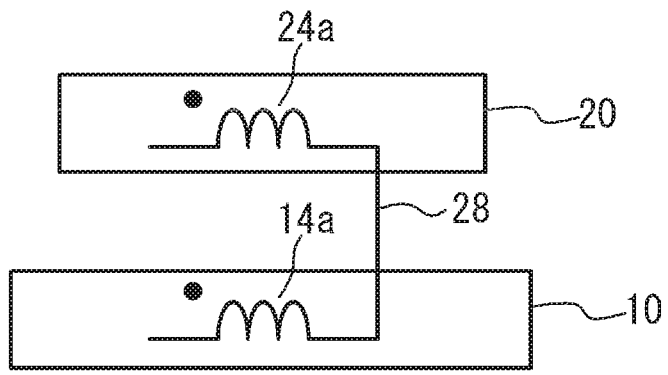

The connection of the coils will be described by using the coils 14a and 24a. FIG. 7A is a plan view of the coil 24a in the first embodiment as viewed from above, FIG. 7B is a plan view of the coil 14a, and FIG. 7C is a circuit diagram of the coils. As illustrated in FIG. 7A, the outer end of the spiral coil 24a is coupled to the pad Pa2, and the inner end of the coil 24a is coupled to the pad Pla2. The outer edge of the coil 24a and the inside of the outer edge (i.e., the region where the coil 24a is located and the region surrounded by the coil 24a) form a coil region 66. The coil 24a has a height of, for example, 1 µm, the wiring line in the coil 24a has a width of, for example, 10 µm, and the coil region 66 has a diameter of, for example, 150 µm.

As illustrated in FIG. 7B, the outer end of the spiral coil 14a is coupled to the pad Pg1, and the inner end of the coil 14a is coupled to the pad Pla1. The outer edge of the coil 14a and the inside of the outer edge (i.e., the region where the coil 14a is located and the region surrounded by the coil 14a) form a coil region 64. The coil 14a has a height of, for example, 1 µm, the wiring line in the coil 14a has a width of, for example, 10 µm, and the coil region 64 has a diameter of, for example, 150 µm. In plan view, the coil regions 64 and 66 overlap, and the pads Pla1 and Pla2 are connected by the bump 28. The distance between the upper surface of the coil 14a and the lower surface of the coil 24a is, for example, 10 µm. As illustrated in FIG. 7C, the coils 14a and 24a are respectively provided to the substrates 10 and 20. The coils 14a and 24a are electrically connected by the bump 28.

Under the assumption that an electric current flows from the pad Pg1 of the substrate 10 to the pad Pa2 of the substrate 20, as indicated by an arrow 60 in FIG. 7B, the electric current flows through the coil 14a clockwise. As indicated by an arrow 62 in FIG. 7A, a clockwise electric current flows through the coil 24a. As described above, since the directions of the electric currents flowing through the coils 14a and 24a are the same, the coils 14a and 24a are additively connected wherein magnetic fluxes are mutually intensified as illustrated in FIG. 7C.

In the first embodiment, the coil 14 (a first coil pattern) is located on the upper surface (a first surface) of the substrate 10 so as to face the lower surface (a second surface) of the substrate 20 across the air gap 36. The coil 24 (a second coil pattern) is located on the lower surface of the substrate 20 so as to face the upper surface of the substrate 10 across the air gap 36. The coils 14 and 24 are connected by the bump 28 (a connection terminal). In plan view, the coils 14 and 24 overlap.

This structure allows the coils 14 and 24 to be located across the air gap, thereby improving the Q-value. Additionally, since the coils 14 and 24 are made to overlap, the size is reduced. Furthermore, the fabrication method is simplified by forming the coil 14 and the wiring line 16 at the same time and forming the coil 24 and the wiring line 16 at the same time.

As illustrated in FIG. 7A through FIG. 7C, the coils 14 and 24 are additively connected. Accordingly, the coils 14 and 24 mutually intensify the magnetic fluxes, thereby increasing the inductance.

In plan view, the coils 14 and 24 may not necessarily overlap. For example, the coil 14 may be located in the peripheral region of the coil region 64, and the coil region 66 may be located in the center region, in which the coil 14 is not located, of the coil region 64. As described above, it is sufficient if at least a part of the coil region 64 overlaps with at least a part of the coil region 66. For example, the coil 24 is located in a region (a second region) on the lower surface of the substrate 20 a part of which overlaps with the coil region 64 (a first region) in plan view.

The coils 14 and 24 are spiral-shaped. This structure increases the inductance. The outer edges of the coils 14 and 24 may have a polygonal shape instead of a circular shape. The coil 24 is formed of the wiring line 26 having a lower resistance than the lower electrode 44 and the upper electrode 48. As described above, at least one of the coils 14 and 24 includes a metal layer having a less resistivity than the material of the electrode exciting an acoustic wave. This structure reduces the resistance components of the coils 14 and 24.

The acoustic wave element 12 (a first acoustic wave element) is located on the upper surface of the substrate 10 so as to be connected to the coil 14 and face the lower surface of the substrate 20 across the air gap 36. This structure allows the coil 14 to be formed on the substrate 10 on which the acoustic wave element 12 is also formed. Thus, the electronic component is reduced in size.

The acoustic wave element 22 (a second acoustic wave element) is located on the lower surface of the substrate 20 so as to be connected to the coil 24 and face the upper surface of the substrate 10 across the air gap 36. This structure allows the coil 24 to be formed on the substrate 20 on which the acoustic wave element 22 is also formed, and the electronic component is thereby reduced in size. At least a part of the acoustic wave element 12 and at least a part of the acoustic wave element 22 overlap in plan view. This structure further reduces the size of the electronic component.

Second Embodiment

Figure 8:
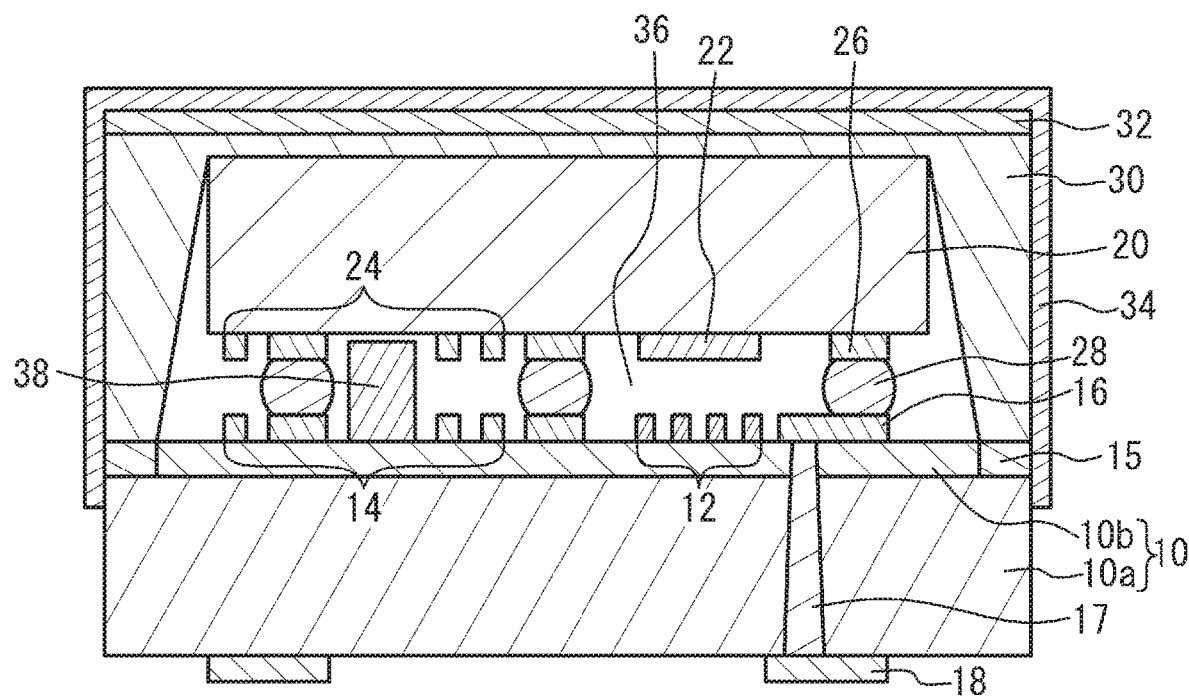
FIG. 8 is a cross-sectional view of an electronic component in accordance with a second embodiment.
Figure 9A:
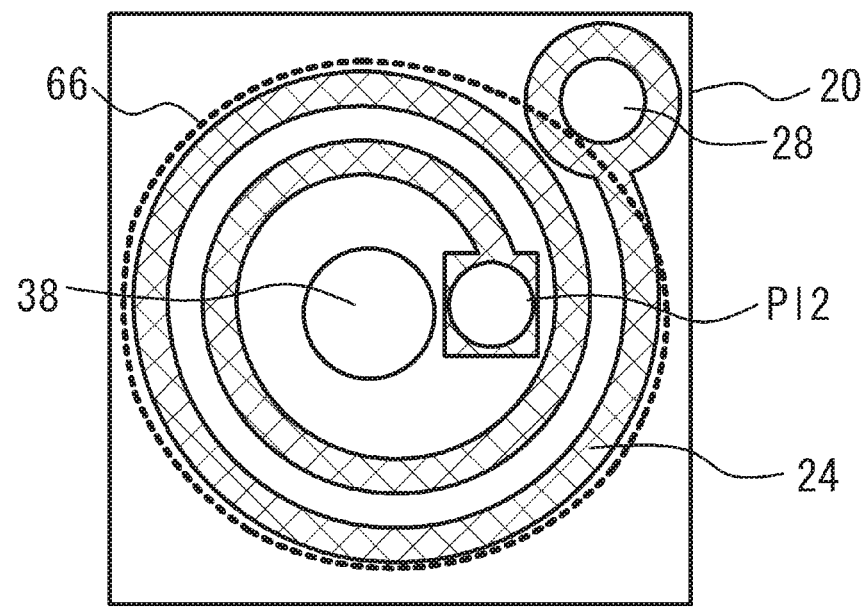
FIG. 9A is a plan view of a coil 24 as transparently viewed from above.
Figure 9B:
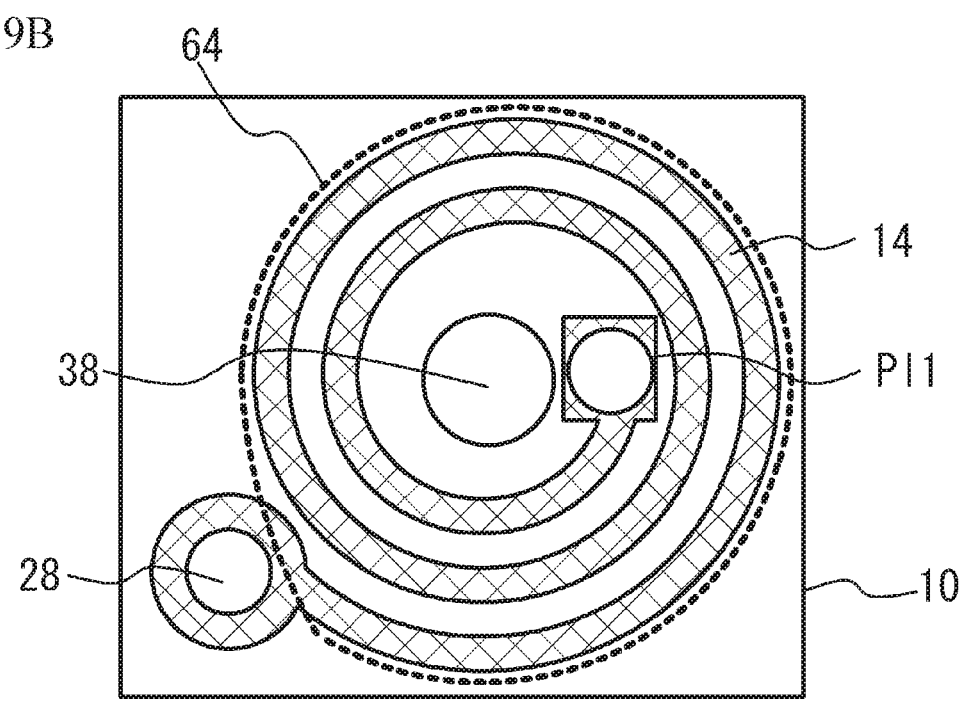
FIG. 9B is a plan view of a coil 14.

FIG. 8 is a cross-sectional view of an electronic component in accordance with a second embodiment. FIG. 9A is a plan view of the coil 24 as transparently viewed from above, and FIG. 9B is a plan view of the coil 14. As illustrated in FIG. 8 through FIG. 9B, a core 38 is located between the substrates 10 and 20 in the coil regions 64 and 66. The core 38 is made of a material having a magnetic permeability greater than that of air. The core 38 is made of, for example, iron nickel alloy (a relative permeability of 1800), a ferritic material (nickel zinc alloy: a relative permeability of 600), or nickel (a relative permeability of 100). The core 38 is formed by, for example, plating, sputtering, or printing.

In the second embodiment, the core 38 with a higher magnetic permeability than the air gap 36 is located between the substrates 10 and 20 in at least one of the coils 14 and 24. This structure increases the inductance.

Third Embodiment

Figure 10:
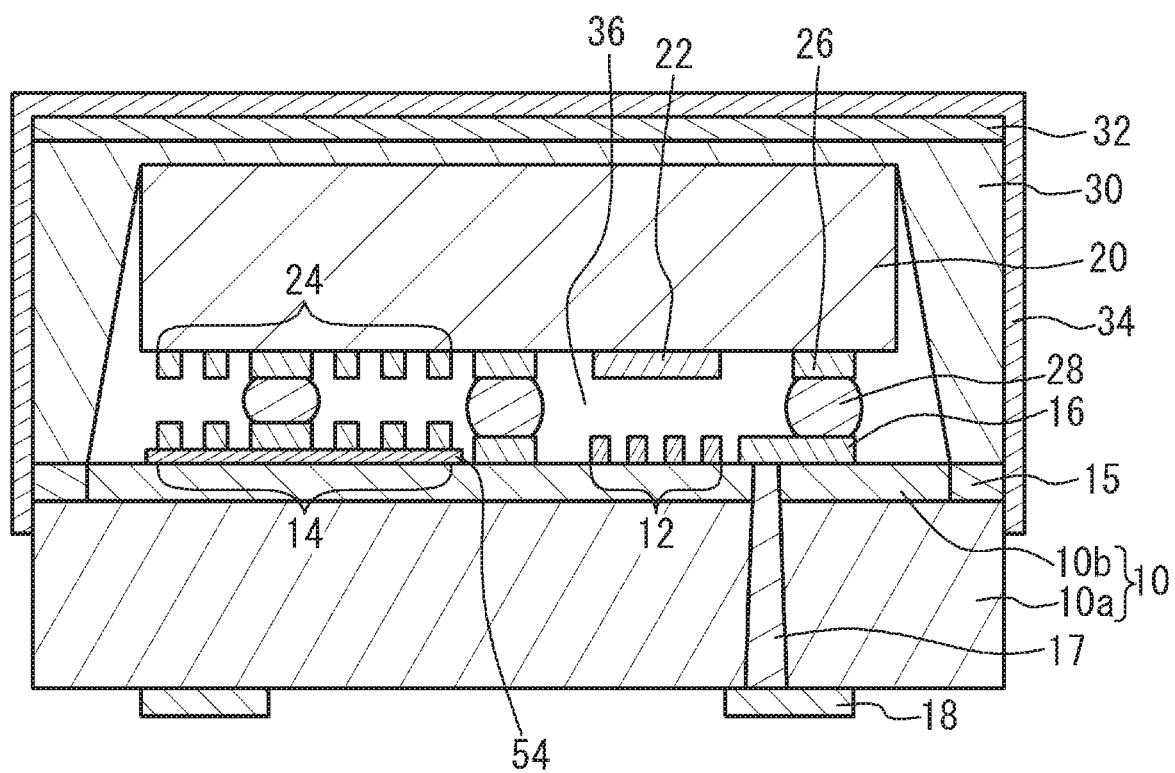
FIG. 10 is a cross-sectional view of an acoustic wave device in accordance with a third embodiment.

FIG. 10 is a cross-sectional view of an acoustic wave device in accordance with a third embodiment. As illustrated in FIG. 10, an insulating film 54 is located on the piezoelectric substrate 10b. The coil 14 is located on the insulating film 54. The insulating film 54 has a less permittivity than the piezoelectric substrate 10b. For example, lithium tantalate has a relative permittivity of approximately 50, and silicon oxide and aluminum oxide have relative permittivities of 4 and 10, respectively. Thus, when the piezoelectric substrate 10b is made of lithium tantalate, the insulating film 54 is made to be a silicon oxide film or an aluminum oxide film. The insulating film 54 has a film thickness of, for example, 1 µm. Other structures are the same as those of the first embodiment, and the description thereof is thus omitted.

In the third embodiment, the acoustic wave element 12 (the first acoustic wave element) is located on the upper surface (a third surface) of the piezoelectric substrate 10b. The insulating film 54 is located on the upper surface of the substrate 10. The insulating film 54 has two surfaces, and one of the two surfaces that is closer to the substrate 20 is the surface (the first surface) on which the coil 14 is located. The insulating film 54 is located on the upper surface (the third surface) of the piezoelectric substrate 10b so as not to be located in the region where the acoustic wave element 12 is located. When the acoustic wave element 12 is a surface acoustic wave resonator, the acoustic wave element 12 is located on the piezoelectric substrate 10b having a large permittivity. When the coil 14 is formed on the piezoelectric substrate 10b, the parasitic capacitance of the coil 14 increases, and the Q-value thus decreases. Thus, the insulating film 54 is provided. This structure reduces the parasitic capacitance of the coil 14, and the Q-value thereby improves.

Fourth Embodiment

Figure 11:
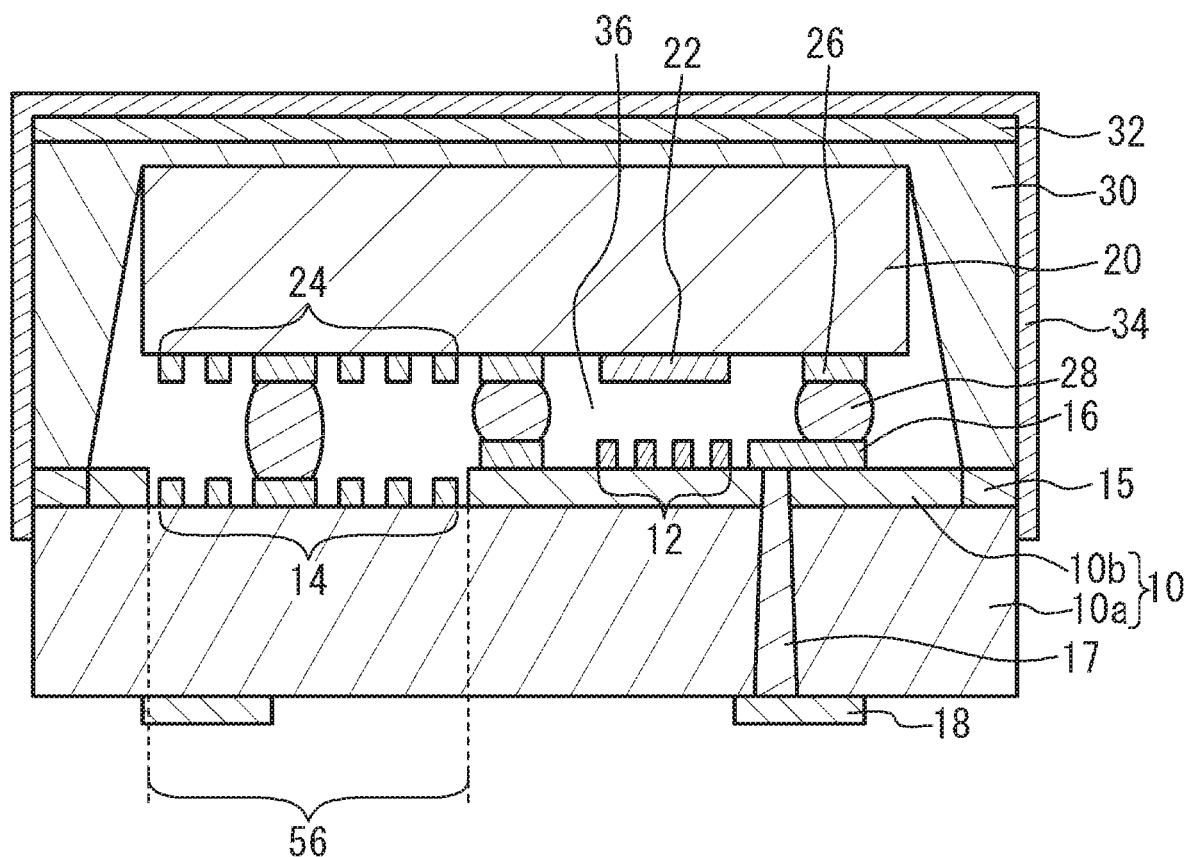
FIG. 11 is a cross-sectional view of an acoustic wave device in accordance with a fourth embodiment.

FIG. 11 is a cross-sectional view of an acoustic wave device in accordance with a fourth embodiment. As illustrated in FIG. 11, in a region 56, a part of the piezoelectric substrate 10b is removed. The coil 14 is located on the support substrate 10a without the piezoelectric substrate 10b. The support substrate 10a has a less permittivity than the piezoelectric substrate 10b. For example, lithium tantalate has a relative permittivity of approximately 50, and sapphire, silicon, and silicon oxide (crystal) have relative permittivities of 10, 12, and 4, respectively. Thus, when the piezoelectric substrate 10b is made of lithium tantalate, the support substrate 10a is made to be a sapphire substrate, a silicon substrate, or a crystal substrate. Other structures are the same as those of the first embodiment, and the description thereof is thus omitted.

In the fourth embodiment, the coil 14 is located on the upper surface of the support substrate 10a. The piezoelectric substrate 10b has a higher permittivity than the support substrate 10a, and the acoustic wave element 22 is located on the upper surface (the third surface), which is one of two surfaces that is closer to the substrate 20, of the piezoelectric substrate 10b. The opposite surface of the piezoelectric substrate 10b from the upper surface is bonded on the upper surface of the support substrate 10a. This structure reduces the parasitic capacitance of the coil 14, and the Q-value thus improves.

The first through fourth embodiments describe an example in which the acoustic wave elements 12 and 22 are respectively located on the substrates 10 and 20, but components other than the coils 14 and 24 and the wiring lines 16 and 26 may not be necessarily located on the substrate 10 or 20. Instead of the acoustic wave elements 12 and 22, for example, a capacitor, an active element, or Micro Electro Mechanical Systems (MEMS) element may be located.

An example in which the acoustic wave elements 12 and 22 are a surface acoustic wave resonator and a piezoelectric thin film resonator, respectively is described, but both the acoustic wave elements 12 and 22 may be surface acoustic wave resonators or piezoelectric thin film resonators. An example in which the transmit filter 50 and the receive filter 52 are ladder-type filters is described, but the transmit filter 50 and the receive filter 52 may be multimode filters. The number of series resonators and parallel resonators constituting a ladder-type filter can be freely selected. An example in which the multiplexer is a duplexer is described, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An electronic component comprising:
a first substrate having a first surface;
a second substrate having a second surface facing the first surface across an air gap;
a first coil pattern that is located on the first surface so as to face the second surface across the air gap;
a second coil pattern that is located in a second region on the second surface and faces the first surface across the air gap, at least a part of the second region overlapping with a first region in a plan view, the first region being formed of a region in which the first coil pattern is located and a region surrounded by the first coil pattern;
a connection terminal connecting a first end of the first coil pattern and a first end of the second coil pattern;
a first acoustic wave element that is connected to a second end of the first coil pattern without going through the second substrate, and is located on the first substrate so as to face the second surface across the air gap; and
a second acoustic wave element that is connected to a second end of the second coil pattern without going through the first substrate and is located on the second substrate so as to face the first surface across the air gap.

2. The electronic component according to claim 1, wherein
the first coil pattern and the second coil pattern overlap in plan view.

3. The electronic component according to claim 1, wherein
the first coil pattern and the second coil pattern are additively connected.

4. The electronic component according to claim 1, wherein
the first coil pattern and the second coil pattern have spiral shapes.

5. The electronic component according to claim 1, further comprising:
a core that is located between the first substrate and the second substrate in at least one of the first coil pattern and the second coil pattern, and has a higher magnetic permeability than the air gap.

6. The electronic component according to claim 1, further comprising
a filter including the first acoustic wave element.

7. The electronic component according to claim 6, further comprising:
a multiplexer including the filter.

8. An electronic component comprising:
a first substrate having a first surface;
a second substrate having a second surface facing the first surface across an air gap;
a first coil pattern that is located on the first surface so as to face the second surface across the air gap;
a second coil pattern that is located in a second region on the second surface and faces the first surface across the air gap, at least a part of the second region overlapping with a first region in a plan view, the first region being formed of a region in which the first coil pattern is located and a region surrounded by the first coil pattern; and
a connection terminal connecting the first coil pattern and the second coil pattern,
wherein the first substrate includes:
a piezoelectric substrate having two surfaces, one of the two surfaces that is closer to the second substrate being a third surface;
a first acoustic wave element located on the third surface so as to face the second surface across the air gap; and
an insulating layer having two surfaces and having a less permittivity than the piezoelectric substrate, the first surface being one of the two surfaces that is closer to the second substrate, the insulating layer being located on the third surface so as not to be located in a region in which the first acoustic wave element is located.

9. An electronic component comprising:
a first substrate having a first surface;
a second substrate having a second surface facing the first surface across an air gap;
a first coil pattern that is located on the first surface so as to face the second surface across the air gap;
a second coil pattern that is located in a second region on the second surface and faces the first surface across the air gap, at least a part of the second region overlapping with a first region in a plan view, the first region being formed of a region in which the first coil pattern is located and a region surrounded by the first coil pattern; and
a connection terminal connecting the first coil pattern and the second coil pattern,
wherein the first substrate includes:
　a support substrate having the first surface;
　a piezoelectric substrate having two surfaces and having a higher permittivity than the support substrate, one of the two surfaces that is closer to the second substrate being a third surface, an opposite surface of the piezoelectric substrate from the third surface being bonded to the first surface, the piezoelectric substrate being not located in a region where the first coil pattern is located; and
　a first acoustic wave element located on the third surface so as to face the second surface across the air gap.

* * * * *